United States Patent [19]
Yan

[11] Patent Number: 5,865,529
[45] Date of Patent: Feb. 2, 1999

[54] LIGHT EMITTING DIODE LAMP HAVING A SPHERICAL RADIATING PATTERN

[76] Inventor: Ellis Yan, 29 Annandale Dr., South Euclid, Ohio 44022

[21] Appl. No.: 814,485

[22] Filed: Mar. 10, 1997

[51] Int. Cl.[6] ....................................................... F21V 5/00
[52] U.S. Cl. .......................... 362/327; 362/329; 362/800; 313/500; 313/512
[58] Field of Search ..................................... 362/800, 327, 362/328, 329, 256, 310, 311; 313/500, 512

[56] References Cited

U.S. PATENT DOCUMENTS

| | | | |
|---|---|---|---|
| 4,013,915 | 3/1977 | Dufft | 362/800 |
| 4,032,963 | 6/1977 | Thome . | |
| 4,041,516 | 8/1977 | Murray . | |
| 4,698,730 | 10/1987 | Sakai et al. | 362/800 |
| 4,849,803 | 7/1989 | Yamamoto et al. . | |
| 4,935,665 | 6/1990 | Murata | 362/800 |
| 5,013,144 | 5/1991 | Silverglate et al. | 362/800 |
| 5,083,192 | 1/1992 | Rzeznik . | |
| 5,122,943 | 6/1992 | Pugh | 362/800 |
| 5,140,220 | 8/1992 | Hasegawa | 362/800 |
| 5,289,082 | 2/1994 | Komoto . | |
| 5,564,819 | 10/1996 | Yamaguchi | 362/800 |

OTHER PUBLICATIONS

Two pages of Digi–Key Corporation's advertising for Panasonic LED's.

*Primary Examiner*—Thomas M. Sember
*Attorney, Agent, or Firm*—Joseph H. Taddeo

[57] ABSTRACT

An improved LED lamp having a uniquely shaped envelope to distribute the radiated light energy into a uniformly distributed spherical pattern. This novel lamp allows a 360 degree viewing angle in a horizontal plane about its central vertical axis, as well as, a 360 viewing angle about the vertical circle. The present invention utilizes a uniquely designed concave lens to establish a focal point within the envelope to re-radiate the radiant energy in a more efficient manner thereby creating a higher intensity without increasing the input power. Conventional LED's have a directional conical shaped pattern of concentrated light energy that provides suitable use in panel indicator lamp applications.

29 Claims, 5 Drawing Sheets

LIGHT EMITTING DIODE LAMP HAVING A SPHERICAL RADIATING PATTERN

FIELD OF INVENTION

The present invention relates to an improved light emitting diode lamp (LED) having a uniquely shaped envelope to distribute the radiated light energy into a uniform spherical pattern, and more particularly, to an improved light emitting diode lamp having a concave conical lens for the uniform distribution of light in all directions.

BACKGROUND OF THE INVENTION

Heretofore display signs, such as exit signs, used incandescent lamps and fluorescent lamps as sources of illumination. While these lamps provide relatively uniform sources of a broad visible spectrum of light, there are several problems that exist when using these lamps in exit sign applications.

Incandescent lamps are relatively inefficient which results in large amounts of entrapped heat energy, shortened life of the bulbs and increased operating costs. The use of incandescent bulbs in exit sign applications requires that suitable ventilation be finished in the design of these signs to remove the entrapped heat. Also, an added undesirable attribute is the frequent maintenance that is required, such as, periodic bulb replacement when lamp failure occurs. Because these lamps are inefficient in operation, there are increased operating costs.

While the use of fluorescent lamps circumvents the problems that are associated with entrapped heat, frequent lamp replacement, and inefficient operation; the size of the fluorescent lamp together with its required ballast, the necessity of higher voltage operation using alternating currents and the higher cost of replacement lamps, offset the advantages for its long term use.

Most recently, semiconductor LED lamps have been used in display and exit sign applications. The use of conventional semiconductor light emitting diodes solves the problems of entrapped heat, lamp longevity, frequent lamp replacement and of higher voltage operation.

However, one problem that exists when using conventional light emitting diodes is that of an non-uniform distribution of emitted light energy. The first attempt in using these diodes as sources of illumination was to provide a diffusion plate to minimize the uneven illumination. While many conventional LED lamps use water clear lenses, still another solution to this problem was to design a conventional LED lamp that included a diffused lens and envelope, such as the Panasonic LN21XP.

Shown in FIG. 1 is a sectional view of a conventional LED lamp having one or more semiconductor chips 150. The transparent envelope 10 has a convex hemispherical shaped lens 12, located at the end of a cylindrically shaped rod 14. A semiconductor chip 150 is mounted to the conductive surface of the first electrode, LED anode 110, which is recessed within the convex reflector 140. A fine wire 130 connects the opposite end of the semiconductor chip 150 to the second electrode 120.

Turning now to FIG. 2, shown is the cone shaped light pattern 16 that is emitted from this LED device. A beam of visible light projects in a cone that ranges in angularity from 12 to 36 degrees dependent upon the intended design usage. This designed lamp finds particular use in instrument panel lamp applications.

Referring now to FIG. 3, illustrated is a sectional view of another conventional LED lamp having one or more semiconductor chips 150. The transparent envelope 20 of the cylindrical shaped rod 14 has a flat top-hat shaped lens 22. The semiconductor chip 150 is mounted to the conductive surface of the first electrode, the LED anode 110, which is recessed within the convex reflector 140. A fine wire 130 connects the opposite end of the semiconductor chip 150 to the second electrode 120.

As shown in FIG. 4, the light that emanates from the semiconductor chips is projected on the flat surface lens 22, thereby giving a uniform surface of illumination that is suitable for use in instrument panel lamp applications.

Examples of the prior art conventional light emitting diode structures will now be discussed in some detail.

U.S. Pat. No. 5,289,082, granted Feb. 22, 1994, S. Komoto, discloses an LED lamp having a lead portion upon which are mounted a plurality of semiconductor chips placed on the tip portion of the lead, all surrounded by a translucent envelope. The envelope is characterized as being formed from a solid body containing parts of a plurality of ellipsoids whose axes extend through the semiconductor chips.

U.S. Pat. No. 5,083,192, granted Jan. 21, 1992, to J. Rzeznik, et al, discloses light concentrating cluster mount for super bright high intensity light emitting diodes.

U.S. Pat. No. 4,849,803, granted Jul. 18, 1989, to T. Yamamoto, et al, discloses a molded resin semiconductor device having a plurality of semiconductor chips surrounded by a low thermal expansion, high thermal conductivity thermosetting resin. This in turn is encapsulated in a flexible resin having high expansion and low conductivity coefficients. A final thermosetting resin coating completes the assembly.

U.S. Pat. No. 4,041,516, granted Aug. 9, 1977, to R. W. Murray, discloses a high intensity light emitting diode having improved radiation intensity and distribution characteristics.

U.S. Pat. No. 4,032,963, granted Jun. 28, 1977, to G. P. Thome, teaches a method and structure for encapsulating a light emitting device. A package is provided to prevent failure due to chemical contaminants.

Many of the above referenced prior art disclose methods and apparatus for concentrating the radiant light energy into a narrow conical beam to optimize the viewing angle so that the light emitting diode is suitable for use in panel lamp applications. Also, some of the above referenced prior art disclose the use of reflective surfaces mounted beneath the array of semiconductor devices to further concentrate the beam emanating from these diodes.

Therefore, there is a particular need for a light emitting diode lamp that provides a source of radiant energy that is uniformly distributed spherically, encompassing all directions so that it can be viewed in any direction, from any circumferential angle, at any angle of elevation.

In this regard, this invention fulfills this need.

SUMMARY OF THE INVENTION

In the past, previously designed LED lamps were designed for directional lamp usage. The directional lamps found particular application as indicator panel lamps that have a primary concentration of visible light.

A specialized need was then encountered for a light emitting diode that is nondirectional and that can be viewed 360 degrees in all three orthogonal planes. The demand was initiated by the requirement for replacement lamps in exit signs.

The first attempt used by the designers were to use a diffusion glass to eliminate the illumination hot spots, when conventional directional LED lamps were used in exit sign applications. At that time no attempt was made to improve or change the LED lamp, the only change was to add a diffuser.

The present invention details the manner in which these semiconductor chips are mounted within the encapsulated transparent envelope. Instead of the lamp projecting light into a narrow angled beam, this novel light emitting diode provides a uniformly distributed light that radiates spherically 360 degrees in all directions, both radially and axially. This newly designed lamp is ideally suited as a source of illumination for exit sign applications. When used in this manner, the need for a diffusion surface is obviated.

To accomplish the primary objective of having a LED lamp that radiates light uniformly in a 360 degree spherical pattern, the conventional hemispherical lens or the conventional flat surface lens is removed from the body of the cylindrically rod shaped envelope. These lens arrangements are then replaced with a newly designed lens that is concave to allow a focal point within the body of the cylinder. When used in conjunction with a reflector behind the semiconductor chips, the emitted light pattern is restricted to a hemispherical shaped pattern, having 360 degrees about the central axis of the cylindrically shaped rod and 180 degrees extending forward from the semiconductor chips.

To complete the design of an LED lamp that radiates light uniformly in a 360 degree spherical pattern, the reflector is removed and the semiconductor chips are secured to the anode first electrode. It was found that the optimal angle of depression is in the range from greater than 90 degrees to less than 135 degrees, as measured from a cylinder side wall, to allow a focal point within the transparent encapsulating envelope. With the focus being at this point the light energy that emanates is increased, thereby improving the efficiency of operation with a greater lamp intensity.

In the preferred embodiment, the concave lens is ideally a conical shaped depression, having an angle of 105 degrees as measured from the cylinder side wall. Using this type of lens structure gives a well focused pin-point of light that re-radiates the optical light energy. As such, the preferred angle circumscribed from the focal point to the envelope side wall is 45 degrees.

In an alternate embodiment, a dished concave or concave hemispherical lens can be used. However, when using this arrangement, it does not provide the sharply defined focal point.

In another aspect of the present invention, conventional LEDs are available in a variety of colors, such as, red, green, amber, orange and blue. By specifically selecting the red coloration in the manufacture and assembly of the present invention, it can find suitable application in use in exit signs, which are notably red in color. By using the present invention in this application, the need for a red filter and a diffuser that are conventionally used in exit signs is eliminated.

Accordingly, it is a principal object of the present invention to provide a light emitting diode that has a uniform distribution of radiant light energy that is nondirectional and can be viewed 360 degrees in all three orthogonal planes.

It is another object of the present invention to provide a light emitting diode that has a uniform distribution of radiant light energy that emanates from its focal point that is established by its newly designed concave lens structure.

It is still another object of the present invention to provide a light emitting diode that has a uniform distribution of radiant light energy by having reflectorless operation.

It is a further object of the present invention to provide a light emitting diode that has a uniform distribution of radiant light energy so that it can be viewed from any direction, both from the radial and axial directions.

It is still another object of the present invention to provide a light emitting diode that has a concave lens to focus the radiated light energy into a secondary point source to re-radiate the visible light energy It is yet another object of the present invention to provide a light emitting diode that has a concave lens that has a conical shape to focus the radiated light energy into a secondary point source to re-radiate the visible light energy.

It is still yet another object of the present invention to provide a light emitting diode that has the LED semiconductor chip mounted directly to the electrode without the further use of a reflective means of concentrating the emission into a directional beam of light energy.

An additional object of the present invention to provide a light emitting diode that eliminates the need for a reflective means to concentrate the emitted light energy for the purpose of directing the beam forward in a cone shaped beam.

It is a final object of the present invention to provide a light emitting diode that supplies diffused lighting emission for use in exit signs and display panel applications.

These and other advantages of the present invention will become more apparent upon further reading of the detailed specification. It should be understood that deviations or modifications can be made without deviating or departing from the spirit of the present invention.

DETAILED DESCRIPTION OF THE PREFERRED EMBODIMENT

Figure 1:
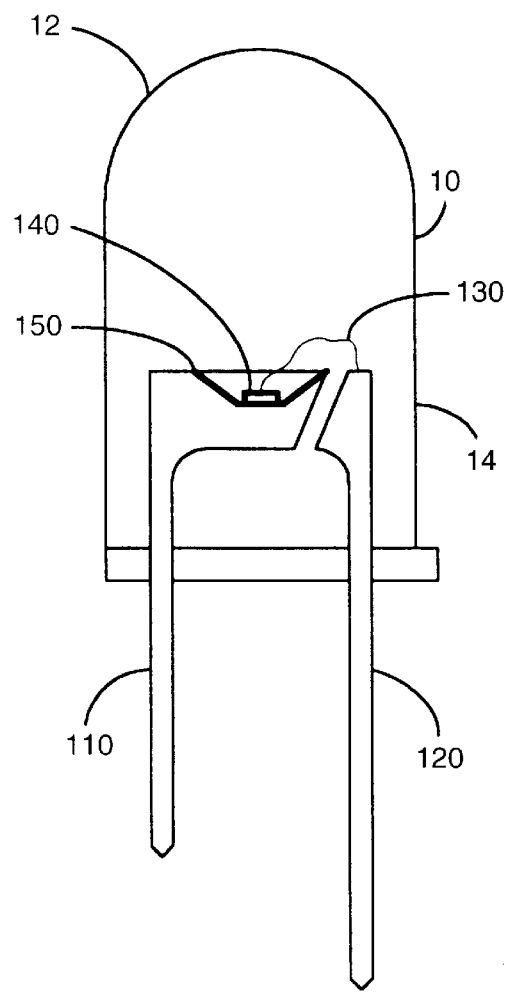
FIG. 1 is a sectional view of a conventional LED lamp having a hemispherical shaped lens found at the end of a cylindrically shaped rod envelope. It has one or more semiconductor chips mounted within a reflective surface.
Figure 2:
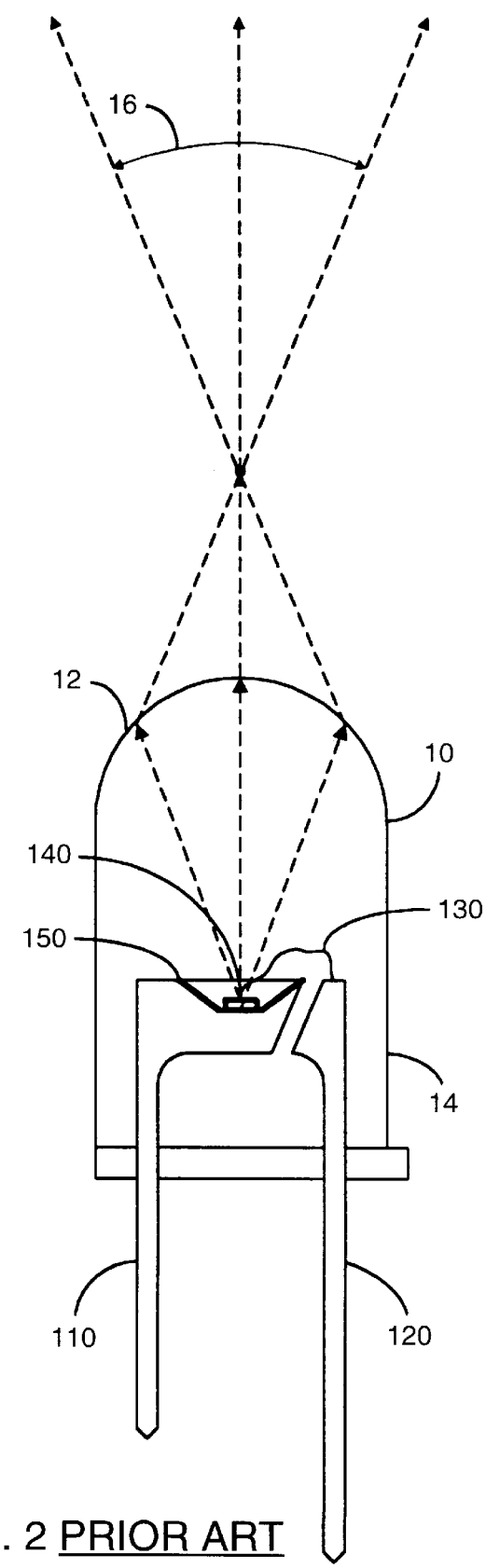
FIG. 2 shows the conical shaped pattern of light emitted from a conventional LED lamp having a hemispherical shaped lens found at the end of a cylindrically shaped rod envelope.
Figure 3:
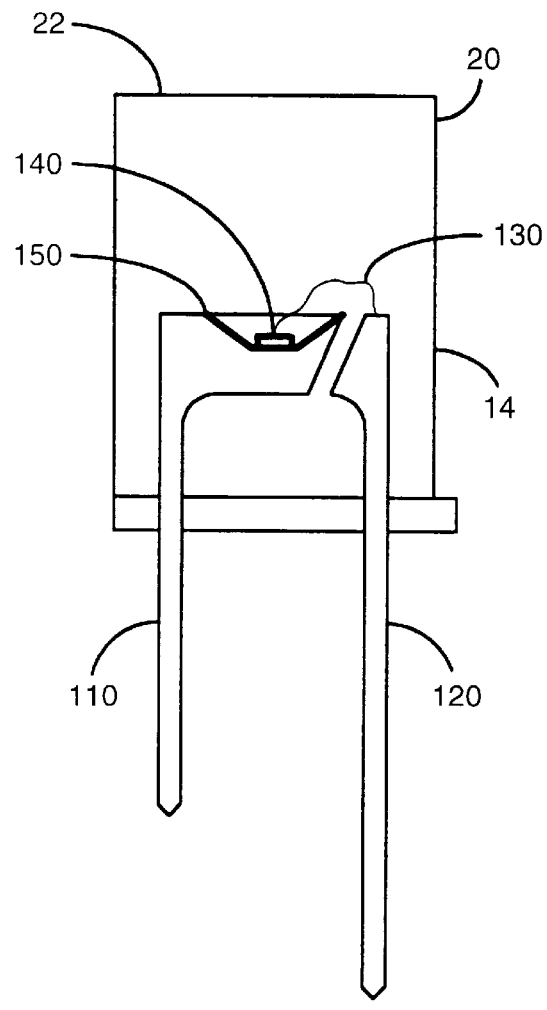
FIG. 3 depicts a sectional view of a conventional LED lamp having a flat top hat shaped lens found at the end of a cylindrically shaped rod envelope. It also uses one or more semiconductor chips mounted within a reflective surface.
Figure 4:
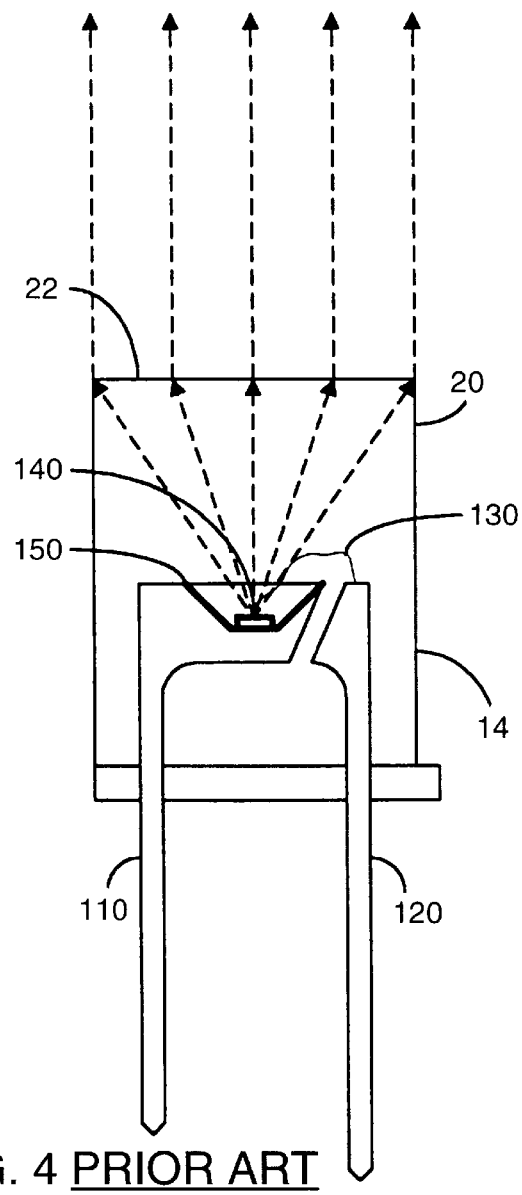
FIG. 4 shows the typical pattern of light that is emitted from a conventional LED lamp having a flat surface shaped lens found at the end of a cylindrically shaped rod envelope.
Figure 5:
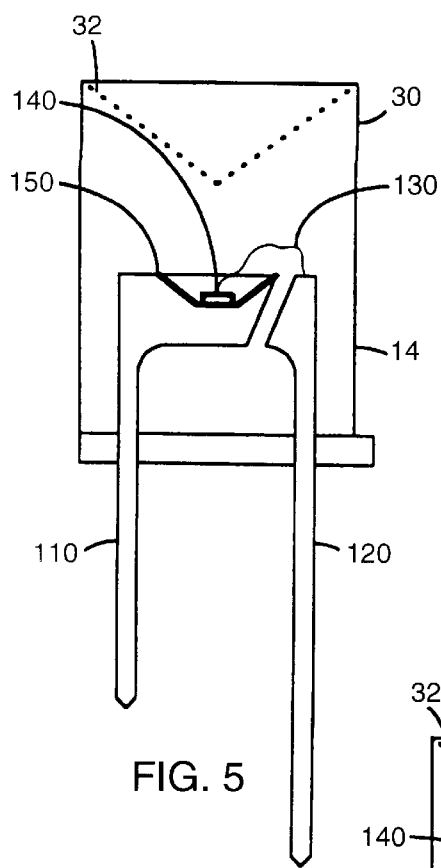
FIG. 5 shows a sectional view of a LED lamp having a concave conical shaped lens that is integral to the end of a cylindrically shaped rod envelope. It too uses one or more semiconductor chips mounted within a reflective surface.
Figure 6:
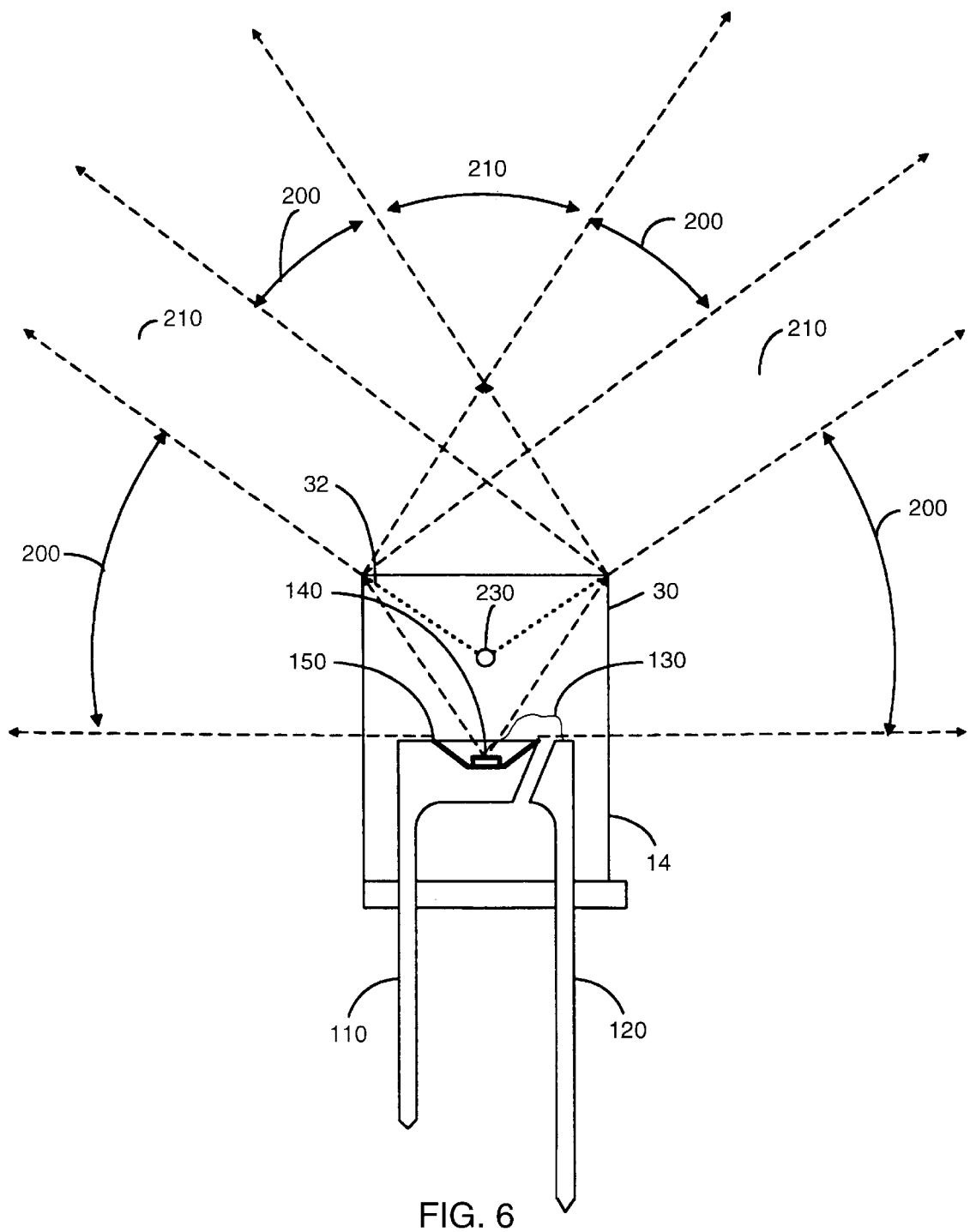
FIG. 6 shows a sectional view of a LED lamp having a concave conical shaped lens that is integral to the end of a cylindrically shaped rod envelope. It too uses one or more semiconductor chips mounted within a reflective surface giving 180 degrees of viewing visibility.

An interim embodiment is shown in FIGS. 5 and 6, where the viewing angle is 180 degrees. With reference to FIG. 5, illustrated is a sectional view of a LED lamp having one or more semiconductor chips 150. The transparent envelope 20 of the cylindrical shaped rod 14 has a concave conical shaped lens 32. The semiconductor chip 150 is mounted to the conductive surface of the first electrode, the LED anode 110, which is recessed within the convex reflector 140. A fine wire 130 connects the opposite end of the semiconductor chip 150 to the second electrode 120. As shown in FIG. 6, the light that emanates from the semiconductor chips is projected on the concave conical shaped lens 22, that is integral to the end of a cylindrically shaped rod envelope 14. It uses one or more semiconductor chips 150 mounted within a reflective surface 140 giving 180 degrees of viewing visibility. Alternatively, the lens 32 may be a separate piece that is fixed to the envelope 14.

Figure 7:
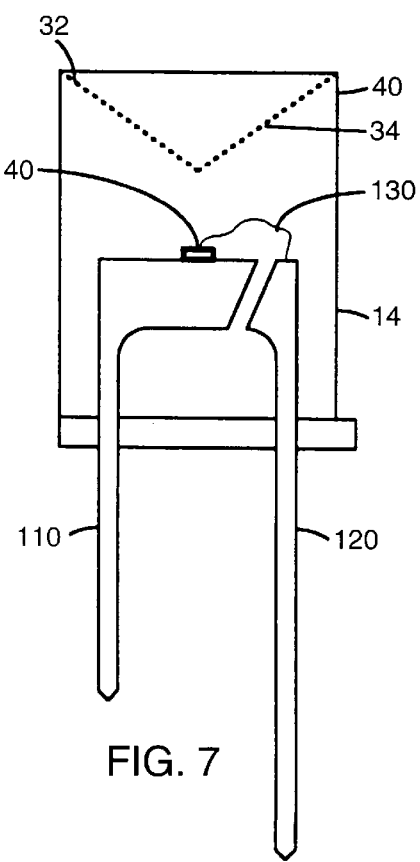
FIG. 7 shows a sectional view of a LED lamp having a concave conical shaped lens that is integral to the end of a cylindrically shaped rod envelope. It too uses one or more semiconductor chips mounted without a reflective surface.
Figure 8:
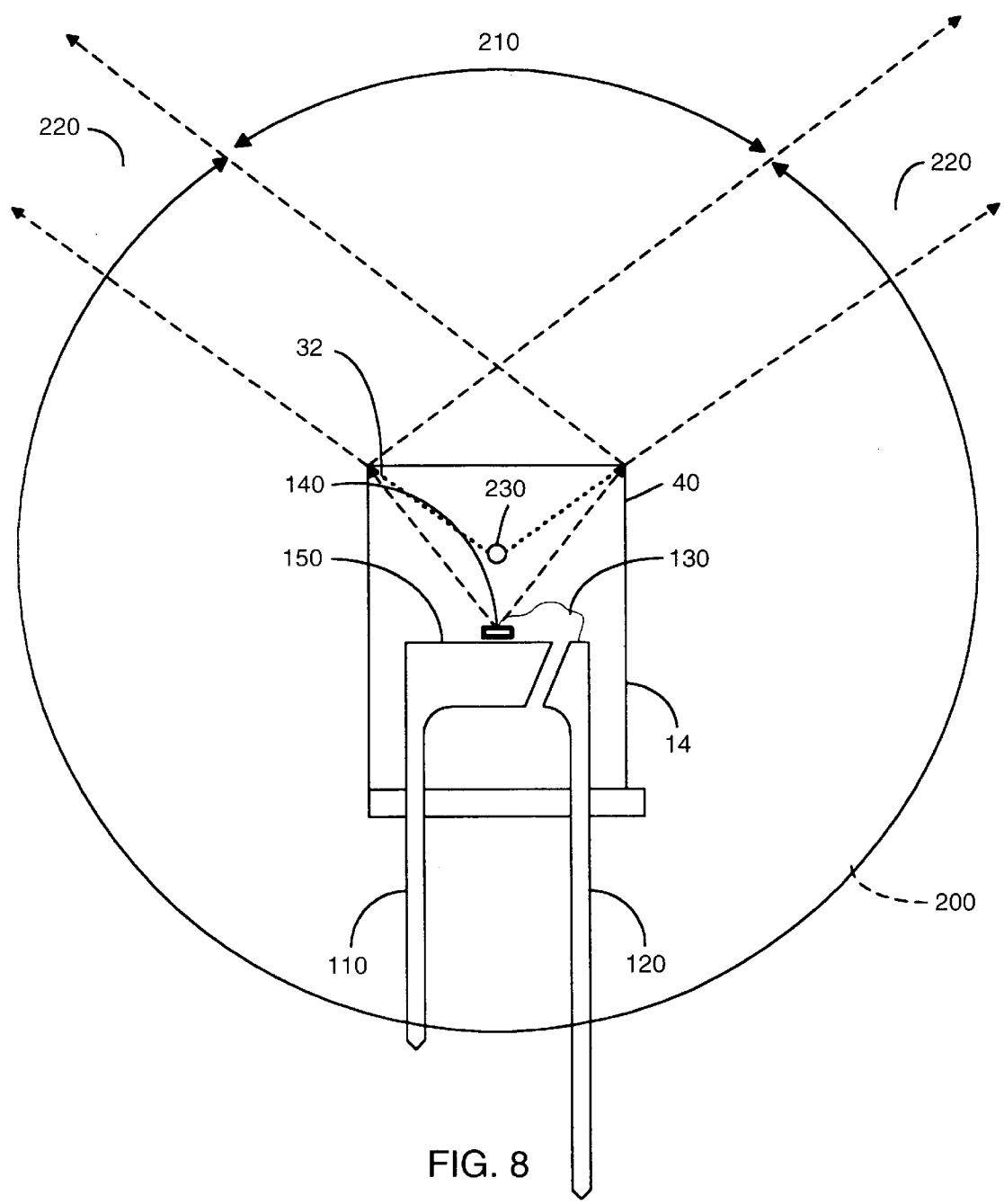
FIG. 8 shows a sectional view of a LED lamp having a concave conical shaped lens that is integral to the end of a cylindrically shaped rod envelope. It too may use one or more semiconductor chips mounted without a reflector, thereby giving a spherical radiation pattern of uniformly distributed light.

Reference is directed to FIGS. 7 and 8 for disclosure of the preferred embodiment of the present invention. FIG. 7 is a sectional view of a semiconductor light emitting device of the preferred embodiment of the present invention.

With reference to the sectional view of FIGS. 7 and 8, the entire light emitting diode is referenced as numeral 40. The body of the light emitting device 14 fully encapsulates all the components contained within the LED. The concave lens 32 is a newly designed configuration comprised of a conical shaped concave lens that focuses the emitted light from the semiconductor device 150 onto the focal point 230.

I have found that the optimal angle of depression is in the range from greater than 90 degrees to 135 degrees, as measured from a cylinder side wall 44. Such angle of depression positions a focal point 230 within the transparent encapsulating envelope 40. The focal point thus formed provides increased light energy that emanates from within the LED body 14, thereby improving the efficiency of operation with a greater lamp intensity.

In the preferred embodiment, the concave lens is ideally a conical shaped depression, having an angle of 105 degrees as measured from the cylinder side wall 44, whereby the angle circumscribed at the focal point or vertex of the conical lens to the side wall is 45 degrees. Using this type of lens structure gives a well focused pin-point of light at the that re-radiates the optical light energy. The conical shape of lens 32 further provides a curved surface or nappe 34 of the cone which serves as a reflector and refractor and as such, light is propagated from the focal point 230 and also from the surface or nappe 34 of lens 32.

The semiconductor chip(s) 140 are mounted to the second electrode, the cathode, 110. A fine wire 130 connects the semiconductor chip 140 to the first electrode, the anode 120.

In typical operation, the highly visible region 200 broadly encompasses the entire volume circumscribing the light emitting diode. Only the small region 210 has a cone of light of diminished intensity. The region 220 is of greater intensity than region 210 and is slightly less intense than the region 200.

Figure 9:
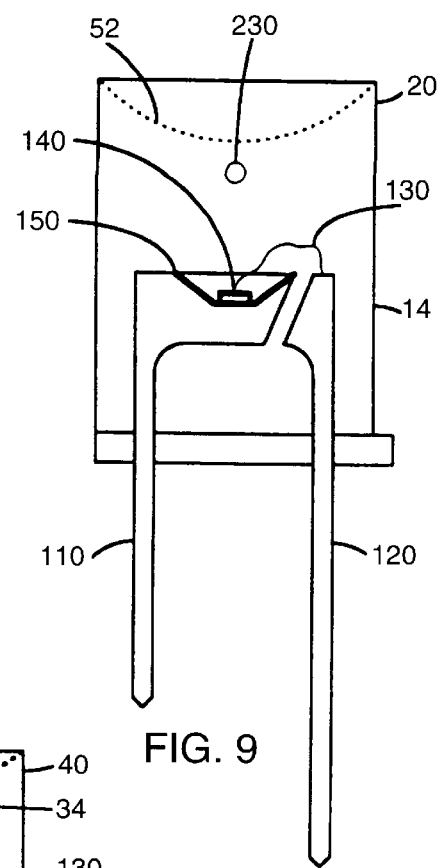
FIG. 9 shows a sectional view of an alternate LED embodiment having a concave hemispherical shaped lens.

In an alternate embodiment, as shown in FIG. 9, the LED body 14 has a concave lens 52 that is hemispherically shaped. It is asymptotic at a preferred angle of 105 degrees.

Still, in another aspect of the present invention, by using a red color chip in the manufacture and assembly of the present invention, it can find application in use in exit signs, which are notably red in color. By using the present invention in this application, the need for a red filter and a diffuser that are conventionally used in exit signs is eliminated.

While specific embodiments of the present invention have been shown and described in detail to illustrate the principles of the invention, it should be understood by those skilled in the art, that other modifications or embellishments can be made without departing from the true spirit of the invention and equivalents of the following claims.

I claim:

1. An improved LED with an at least one semiconductor chip in electronic communication with first and second electrodes for a source of light, the at least one chip encased in a transparent, cylindrically shaped rod envelope having a central axis, a side wall, and an end opposite the chip, the improvements comprising:

a concave lens with a concavity depressed toward the at least one chip and into the end of the envelope.

2. The improved LED of claim 1, wherein the concave lens has a conical shape with a taper toward the at least one chip and a vertex.

3. The improved LED described in claim 2, wherein the lens is integral with the envelope side wall.

4. The improved LED of claim 2, wherein the lens is a separate piece fixed to the envelope.

5. The improved LED of claim 3, wherein the lens further comprises a focal point for light emitted from the chip, the focal point located at the vertex.

6. The improved LED of claim 5, wherein the focal point is positioned within the envelope body.

7. The improved LED of claim 6, the focal point comprising a second light source for re-radiation of light energy from the at least one chip.

8. The improved LED of claim 7, wherein lens focal point comprises a refractor of light received from the at least one chip.

9. The improved LED of claim 8, wherein the lens focal point comprises a reflector of light received from the at least one chip.

10. The improved LED of claim 9, wherein the lens forms an angle of depression with the side wall.

11. The improved LED of claim 10, wherein the angle of depression is in a range from 90 degrees to 135 degrees as measured from the side wall.

12. The improved LED of claim 11, wherein the angle of depression is essentially 105 degrees as measured from the side wall.

13. The improved LED of claim 12, wherein the at least one chip is secured directly to the first electrode.

14. The improved LED of claim 13, wherein the light from the chip that impinges on the focal point re-radiates uniformly in a 360 spherical pattern from the lamp.

15. The improved LED of claim 1, further comprising a reflector mounted behind the at least one chip to provide a hemispherical shaped light pattern having 360 degrees about the central axis of the rod and extending 180 degrees forward from the chip.

16. The improved LED of claim 15, wherein the concave lens has a hemispherical shape with no defined focal point.

17. An LED having an at least one semiconductor chip for producing light, the at least one chip mounted within a transparent envelope formed by side walls of a cylinder body, the LED comprising:

a cone shaped lens with a cone that projects longitudinally inward into the cylinder body toward the at least one semiconductor.

18. The LED of claim 17, wherein the lens comprises the shape of a right circular cone having a vertex.

19. The LED of claim 18, wherein the envelope includes a central axis that intersects the vertex within the cylinder body.

20. The LED of claim 19, further including a secondary point light source that re-radiates the light propaged from the chip.

21. The LED of claim 20, wherein the vertex is directly opposed to the chip.

22. The LED of claim 21, wherein an angle circumscribed by vertex to the side walls is 45 degrees.

23. The LED of claim 22, wherein the secondary point light source comprises a focal point for light from the chip, the focal point located at the vertex.

24. The LED of claim 23, wherein the lens surface comprises a curved nappe that reflects and refracts light from the chip.

25. The LED of claim 24, wherein the LED illuminates a surrounding volume comprising three dimensions delineated by a circumferential angle and an angle of elevation; and, the LED propagated, re-radiated, reflected and refracted light is visible in the three dimensions from the LED, at any circumferential angle and at any angle of elevation.

26. The LED of claim 25, having a uniform distribution of radiant light that is nondirectional and can be viewed 360 degrees in all three orthogonal planes, thereby obviating the need for a diffusion surface.

27. The LED of claim 26, wherein the chip includes a specific color, thereby obviating the need for a light filter to produce light of the specific color.

28. The LED of claim 27, wherein the LED is employed for illumination of an exit sign; and, a red chip is incorporated in the LED to produce red light, thereby obviating the need for a red filter in the exit sign.

29. The LED of claim 28, wherein a diffuse light is emitted from the LED, thereby obviating the requirement for a diffuser in an exit sign.

* * * * *